(12) United States Patent
Braithwaite

(10) Patent No.: US 9,184,710 B2
(45) Date of Patent: Nov. 10, 2015

(54) DIGITAL PREDISTORTION OF A POWER AMPLIFIER FOR SIGNALS COMPRISING WIDELY SPACED CARRIERS

(75) Inventor: Richard Neil Braithwaite, Orange, CA (US)

(73) Assignee: Intel Corporation, Santa Clara, CA (US)

( * ) Notice: Subject to any disclaimer, the term of this patent is extended or adjusted under 35 U.S.C. 154(b) by 550 days.

(21) Appl. No.: 13/368,125

(22) Filed: Feb. 7, 2012

(65) Prior Publication Data

US 2012/0200355 A1 Aug. 9, 2012

Related U.S. Application Data

(60) Provisional application No. 61/441,010, filed on Feb. 9, 2011.

(51) Int. Cl.
*H04L 27/00* (2006.01)
*H04L 25/03* (2006.01)
*H04L 25/49* (2006.01)
(Continued)

(52) U.S. Cl.
CPC ............... *H03F 3/24* (2013.01); *H03F 1/3247* (2013.01); *H03F 1/3258* (2013.01); *H03F 3/189* (2013.01); *H04L 27/368* (2013.01); *H03F 2201/3209* (2013.01); *H03F 2201/3224* (2013.01); *H04B 1/0028* (2013.01); *H04B 2001/0425* (2013.01)

(58) Field of Classification Search
CPC .... H04B 17/001; H04B 1/0007; H04B 1/001; H04B 7/0857; H04L 27/01; H04L 27/2334; H04L 27/2647; H03F 2201/3224; H03F 3/24; H03F 1/3247; H03F 2200/336; H03F 2200/451; H04W 52/52; H03H 21/0027

USPC ......... 375/219, 222, 229–236, 284, 285, 296, 375/297, 298, 299, 316, 318, 317, 319, 312, 375/311, 346–350, 220, 221, 375/240.26–240.29, 278, 295, 306, 307, 375/302, 324, 325, 347, 340, 339, 354, 358
See application file for complete search history.

(56) References Cited

U.S. PATENT DOCUMENTS

2005/0008096 A1* 1/2005 Iwasaki et al. ................. 375/297
2005/0148304 A1* 7/2005 Jerng .............................. 455/75

(Continued)

OTHER PUBLICATIONS

R. N. Braithwaite, "Adaptive digital predistortion of nonlinear power amplifiers using reduced order memory correction," presented at workshop on "Highly efficient linear power transmitters for wireless applications based on switching mode amplifiers," 2008 IEEE MTT-S International Microwave Symposium, Atlanta, GA, Jun. 15-20, 2008.

(Continued)

*Primary Examiner* — Linda Wong
(74) *Attorney, Agent, or Firm* — Schwegman Lundberg & Woessner, P.A.

(57) ABSTRACT

Digital predistortion ("DPD") of an RF power amplifier for signals comprising two widely spaced carrier clusters is proposed. The basis waveforms within the DPD are selected to allow for the use of a lower sampling rate. As one example, multi-carrier signals spanning 60 MHz of bandwidth may be linearized using a sample rate of 100 MHz for the DPD module and the observation path, as opposed to a sample rate exceeding 300 MHz (5 times Nyquist) used conventionally. A transmit (Tx) filter is located after the power amplifier to attenuate distortion modes exceeding the sampling rate used.

19 Claims, 5 Drawing Sheets

(51) Int. Cl.
*H03F 3/24* (2006.01)
*H03F 1/32* (2006.01)
*H03F 3/189* (2006.01)
*H04L 27/36* (2006.01)
*H04B 1/00* (2006.01)
*H04B 1/04* (2006.01)

(56) References Cited

U.S. PATENT DOCUMENTS

| | | | |
|---|---|---|---|
| 2005/0156662 A1* | 7/2005 | Raghupathy et al. | 330/10 |
| 2007/0216554 A1* | 9/2007 | Ahmed | 341/118 |
| 2008/0260066 A1* | 10/2008 | Cai et al. | 375/297 |
| 2010/0295612 A1* | 11/2010 | Ohkawara et al. | 330/149 |
| 2011/0050339 A1* | 3/2011 | Ohkawara et al. | 330/149 |
| 2011/0096865 A1* | 4/2011 | Hori et al. | 375/295 |
| 2011/0235748 A1* | 9/2011 | Kenington | 375/296 |

OTHER PUBLICATIONS

R. N. Braithwaite, "Wide bandwidth adaptive digital predistortion of power amplifiers using reduced order memory correction," 2008 IEEE MTT-S IMS., Atlanta, GA, Jun. 15-20, 2008, pp. 1517-1520.

* cited by examiner

US 9,184,710 B2

DIGITAL PREDISTORTION OF A POWER AMPLIFIER FOR SIGNALS COMPRISING WIDELY SPACED CARRIERS

RELATED APPLICATION INFORMATION

The present application claims priority under 35 U.S.C. Section 119(e) to U.S. Provisional Patent Application Ser. No. 61/441,010 filed Feb. 9, 2011, the disclosure of which is incorporated herein by reference in its entirety.

BACKGROUND OF THE INVENTION

1. Field of the Invention

The present invention relates in general to predistortion linearized amplifier systems and related methods. More particularly, the invention is directed to adaptive predistortion systems and methods for transmitters having widely spaced carriers.

2. Description of the Prior Art and Related Background Information

RF transmitters employ power amplifiers which often exhibit undesirable nonlinear gain. When RF transmitters transmit several carrier signals occupying different channels, intermodulation distortion between the carriers spreads the distortion over a large bandwidth.

Accordingly, a need exists to improve the intermodulation distortion for transmitters having several carriers.

SUMMARY OF THE INVENTION

In a first aspect, the present invention provides a predistortion linearized amplifier system for amplifying a communication signal having at least first and second separate signal components. The system comprises one or more inputs adapted to receive a communication signal, the communication signal having at least first and second separate signal components, and a digital predistorter coupled to the one or more inputs and receiving the first and second separate signal components. The digital predistorter outputs a combined predistorted output signal based on first and second predistortion coefficients applied to the first and second separate signal components and intermodulation distortion products of the first and the second separate signal components. The system further comprises a digital to analog converter coupled to receive the combined predistorted output signal and provide an analog signal and a power amplifier coupled to the digital to analog converter and amplifying the analog signal to provide an amplified analog signal.

In a preferred embodiment, the predistortion linearized amplifier system further comprises a bandpass filter coupled to the power amplifier and filtering the amplified analog signal to provide a bandpass filtered signal, an output sampling coupler coupled to the bandpass filter and sampling the bandpass filtered signal to provide a sampled bandpass filtered signal, and a feedback circuit path coupled to the output sampling coupler. The feedback path comprises an analog to digital convertor converting the sampled bandpass filtered signal to a digital sampled signal representative of the bandpass filtered signal and a coefficient estimator receiving the digital sampled signal and the first and second separate signal components and providing the first and second predistortion coefficients to the digital predistorter.

The digital predistorter preferably comprises a first up-sampler adapted to receive the first separate signal component and providing a first up-sampled signal, a first delay coupled to the first up-sampler and providing a delayed first up-sampled signal, a second up-sampler adapted to receive the second separate signal component and providing a second up-sampled signal, and a second delay coupled to the second up-sampler and providing a delayed second up-sampled signal. The digital predistorter provides a first predistorted output signal based on a first set of intermodulation distortion products of the first and second up-sampled signals, the first predistortion coefficients, and the delayed first up-sampled signal, and provides a second predistorted output signal based on a second set of intermodulation distortion products of the first and second up-sampled signals, the second predistortion coefficients, and the delayed second up-sampled signal. The digital predistorter combines the first and second predistorted output signals to provide the combined predistorted output signal.

The digital predistorter may preferably further comprise a first intermodulation distortion product generator receiving the first and second up-sampled signals, the first intermodulation distortion generator providing the first set of intermodulation distortion products of the first and second up-sampled signals, a first multiplier circuit coupled to the first intermodulation distortion generator which receives and applies the first predistortion coefficients to the first set of intermodulation distortion products to provide a first predistortion signal, and a first combiner adapted to receive the delayed first up-sampled signal and coupled to the first multiplier circuit, the first combiner providing a first predistorted input signal based on the delayed first up-sampled signal and the first predistortion signal. The digital predistorter may preferably further comprise a second intermodulation distortion product generator receiving the first and second up-sampled signals, the second intermodulation distortion generator providing the second set of intermodulation distortion products of the first and second up-sampled signals, a second multiplier circuit coupled to the second intermodulation distortion generator which receives and applies the second predistortion coefficients to the second set of intermodulation distortion products to provide a second predistortion signal, and a second combiner adapted to receive the delayed second up-sampled signal and coupled to the second multiplier circuit, the second combiner providing a second predistorted input signal based on the delayed second up-sampled signal and the second predistortion signal.

The digital predistorter may further comprise a first digital oscillator providing a first digital intermediate signal, a first oscillator multiplier which receives and combines the first predistorted input signal and the first digital intermediate signal to provide the first predistorted output signal, a second digital oscillator providing a second digital intermediate signal, and a second oscillator multiplier which receives and combines the second predistorted input signal and the second digital intermediate signal to provide the second predistorted output signal. The first and second up-samplers are preferably adapted to up sample the first and second separate signal components at a sampling rate to approximately match the bandwidth of the bandpass filter. The bandpass filter attenuates distortion modes exceeding the sampling rates of the first and second up-samplers.

In another aspect, the present invention provides a predistorter for a communication signal having at least first and second separate signal components. The predistorter comprises a first input adapted for receiving a first separate signal component, a second input adapted for receiving a second separate signal component, a first intermodulation distortion compensation circuit receiving first predistortion coefficients and the first and second separate signal components, the first intermodulation distortion compensation circuit creating a first set of intermodulation distortion products and providing a first predistorted output signal based on the first set of intermodulation distortion products, the first predistortion coefficients, and the first separate signal component, and a second intermodulation distortion compensation circuit receiving second predistortion coefficients and the first and second separate signal components, the second intermodulation distortion compensation circuit creating a second set of intermodulation distortion products and providing a second predistorted output signal based on the second set of intermodulation distortion products, the second predistortion coefficients, and the second separate signal component. The predistorter further comprises a combiner circuit which receives and combines the first and second predistorted output signals to provide a combined predistorted output signal.

In a preferred embodiment, the predistorter compensates for the third order intermodulation products of the first and second separate signal components. The first intermodulation distortion compensation circuit preferably comprises a first intermodulation distortion product generator providing the first set of intermodulation distortion products of the first and second separate signal components, a first multiplier circuit coupled to the first intermodulation product distortion generator which receives and applies the first predistortion coefficients to the first set of intermodulation distortion products to provide a first predistortion signal, and a first combiner coupled to the first input and the first multiplier circuit, the first combiner providing a first predistorted input signal based on the first separate signal component and the first predistortion signal. The first intermodulation distortion compensation circuit preferably also comprises a first digital oscillator providing a first digital intermediate signal and a first oscillator multiplier which receives and combines the first predistorted input signal and the first digital intermediate signal to provide the first predistorted output signal. The second intermodulation distortion compensation circuit preferably comprises a second intermodulation distortion product generator providing the second set of intermodulation distortion products of the first and second separate signal components, a second multiplier circuit coupled to the second intermodulation distortion product generator which receives and applies the second predistortion coefficients to the second set of intermodulation distortion products to provide a second predistortion signal, and a second combiner coupled to the second input and the second multiplier circuit, the second combiner providing a second predistorted input signal based on the second separate signal component and the second predistortion signal. The second intermodulation distortion compensation circuit preferably also comprises a second digital oscillator providing a second digital intermediate signal and a second oscillator multiplier which receives and combines the second predistorted input signal and the second digital intermediate signal to provide the second predistorted output signal.

The predistorter preferably further comprises a first up-sampler coupled to the first input and providing a first up-sampled signal, and a second up-sampler coupled to the second input and providing a second up-sampled signal, wherein the first and second up-samplers are adapted to up sample the first and second separate signal components at a sampling rate to approximately match the allowed transmission bandwidth of the communication signal, and wherein first the first and second intermodulation distortion compensation circuits operate on the first and second up-sampled signals.

In another aspect, the present invention provides a method for predistortion linearization of a signal in a communication system, the signal having two separate components. The method comprises receiving a first input signal component, receiving a second input signal component, and receiving first and second predistortion coefficients. The method further comprises providing a first predistorted output signal based on a first set of intermodulation distortion products of the first and second signal components, the first predistortion coefficients, and the first digital input signal and providing a second predistorted output signal based on a second set of intermodulation distortion products of the first and second signal components, the second predistortion coefficients, and the second input signal component. The method further comprises combining the first and second predistorted output signals to provide a combined predistorted output signal.

In a preferred embodiment of the method for predistortion linearization the first and second set of intermodulation distortion products comprise third order intermodulation product signals. The method preferably further comprises converting the combined predistorted output signal into an analog output signal, and filtering the analog output signal by a transmission filter to provide a bandpass filtered signal, wherein the third order intermodulation product signals comprise intermodulation product signals having frequencies within the transmission filter passband.

The method for predistortion linearization preferably further comprises sampling the bandpass filtered signal to provide a sampled bandpass filtered signal and adaptively estimating the first and second predistortion coefficients based on the sampled bandpass filtered signal. Adaptively estimating the first and second predistortion coefficients preferably further comprises comparing the sampled bandpass filtered signal with the input signal components to adaptively update the first and second predistortion coefficients. Adaptively estimating the first and second predistortion coefficients preferably further comprises computing iteratively updated first and second predistortion coefficients based on prior first and second predistortion coefficients, respectively.

The method for predistortion linearization preferably further comprises up sampling the first and second input signal components at a sampling rate that meets or exceeds the bandwidth of the filter passband. The frequencies of the first and second signals may span the bandwidth of the transmission filter passband. Providing a first predistorted output signal preferably further comprises combining a first predistorted input signal based on the first set of intermodulation distortion products of the first and second signal components, the first predistortion coefficients, and the first digital input signal with a first digital intermediate signal to provide the first predistorted output signal. Providing a second predistorted output signal preferably further comprises combining a second predistorted input signal based on the second set of intermodulation distortion products of the first and second signal components, the second predistortion coefficients, and the second input signal component with a second digital intermediate signal to provide the second predistorted output signal.

Further features and aspects of the invention are set out in the following detailed description.

DETAILED DESCRIPTION OF THE INVENTION

Figure 1:
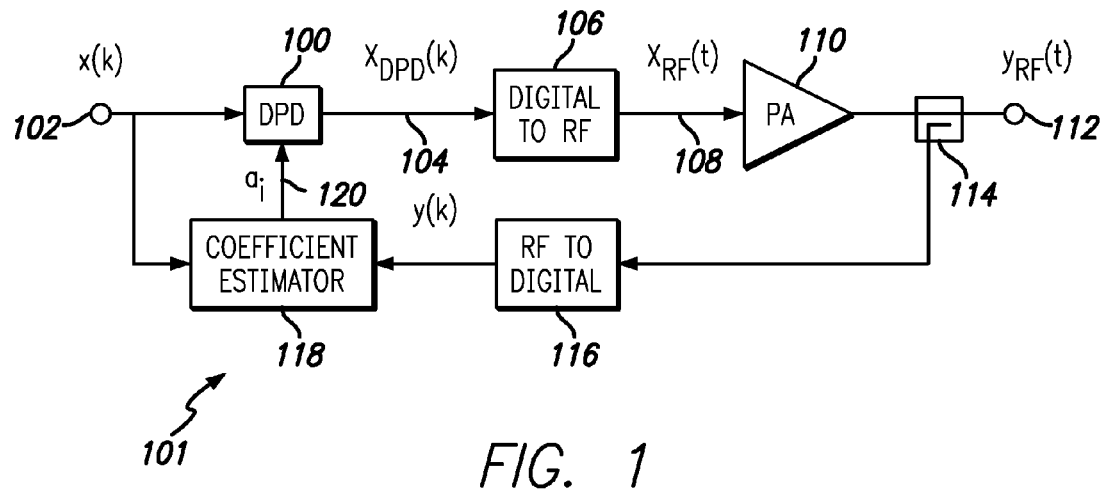
FIG. 1 is a block schematic diagram of a digital transmitter with adaptive digital predistortion.

A simplified block diagram of transmitter 101 with a digital baseband input signal, x(k) 102, is shown in FIG. 1 having a detailed version of the upper path shown in FIG. 5 and discussed below. Input signal x(k) 102 represents a multi-signal carrier having at least two separate signal components on separate lines or on a single line. It is provided to the series combination of a digital predistortion ("DPD") module 100, digital to RF circuitry 106, and power amplifier 110 ("PA"). The output of the PA is provided to an antenna (not shown). The digital to RF circuitry 106 comprises, typically, digital to analog converter (DAC) circuitry and analog to RF up-conversion circuitry; however, any reference to digital to analog converter (DAC) in the text should be interpreted as including the up-conversion from analog to RF.

The DPD function is controlled by the selection of the DPD coefficients $a_i$. An adaptive DPD system requires an observation path to measure the output signal $y_{RF}$ 112, which is usually down-converted and digitized to a baseband signal y(k). The observation path comprises a sampling coupler 114 coupled to the output 112, a RF to digital convertor 116, and a coefficient estimator 118 which provides the DPD coefficients $a_i$ to the DPD module 100 via line 120. The output measurement is used to estimate the residual nonlinearity in the transmitter and the error in the DPD coefficients compared to the optimal setting. The DPD coefficients are updated recursively to reduce the error. The RF to digital convertor 116 comprises, typically, RF to analog down-conversion circuitry and analog to digital converter (ADC) circuitry; however, any reference to analog to digital converter (ADC) in the text should be interpreted as including the down-conversion from RF to analog.

The predistorted baseband signal is $$x_{DPD}(k) = \sum_{i=1}^{N} a_i \cdot \gamma_i(k) \quad (1)$$

where $\gamma_i(k)$ are basis waveforms that are a function of x(k), $a_i$ are complex DPD coefficients, and N is the number of basis waveforms used in the DPD model. A possible set of basis waveforms for DPD is the memory polynomial applied to the gain term:

$$\gamma_i(k) = |x(k-m)|^n \cdot x(k) \quad (2)$$

where the index i is a function of the polynomial order n and the memory offset m.

The error in the DPD coefficients, denoted by $\Delta a_i$ is estimated by minimizing $$J_{DPD} = \sum_k \left| L\{\varepsilon(k)\} - \sum_{i=1}^{N} \Delta a_i \cdot L\{\gamma_i(k)\} \right|^2 \quad (3)$$

where L{ } is a linear operator that includes filtering, and $$L\{\varepsilon(k)\} = G_o^{-1}\{y(k)\} - L\{x(k)\} \quad (4)$$

where $G_o$ is the nominal gain. The Digital Filter L{ } is Selected to Attenuate the Allocated channels containing the input signal: that is, L{x(k)}=0. This removes biases in the least mean square ("LMS") estimate of $\underline{\Delta a}$ that are due to unmodeled in-band errors, which are often larger in power than the distortion generated. The coefficient estimation is discussed further below.

Figure 2:
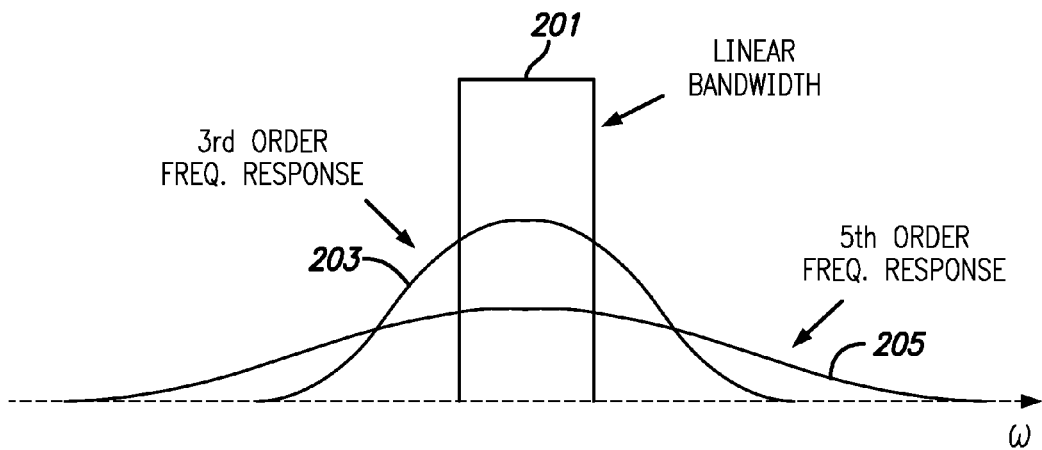
FIG. 2 is a representation of the spectra for a band limited signal and intermodulation ("IMD") signal formed in response to third and fifth order nonlinearities.

When a band limited signal passes through a nonlinear PA, intermodulation distortion ("IMD") is created. The bandwidths of the IMD waveforms are determined by the polynomial order of the nonlinearity, as shown in FIG. 2, which depicts a graphical representation of the linear signal 201, the $3^{rd}$ order frequency response signal 203, and the $5^{th}$ order frequency response signal 205. For example, the IMD associated with a nonlinearity of order P will occupy P times the bandwidth of the linear signal.

Figure 3:
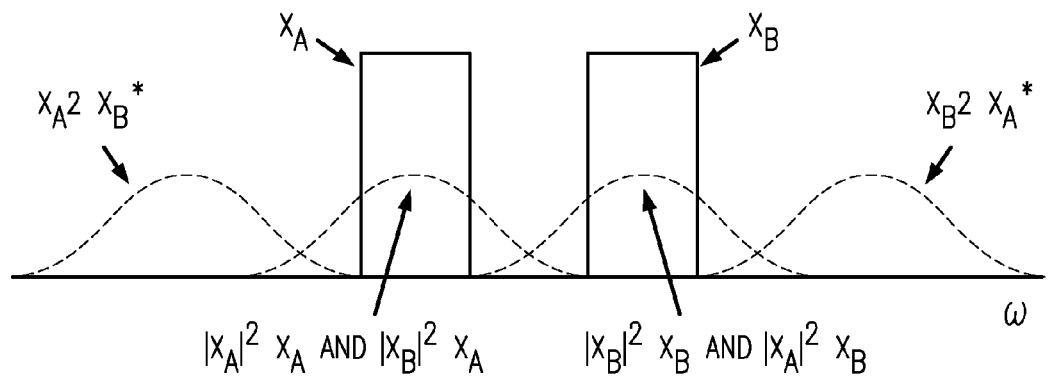
FIG. 3 is a representation of the linear and third order IMD spectra for two signals $x_A$ and $x_B$.

The RF transmitter may transmit several carrier signals occupying different channels. In such cases, the IMD comprises components originating from the intermodulation within individual carriers as well as intermodulation between carriers. The effect of the latter is to spread the distortion over a much larger bandwidth as shown in FIG. 3.

In order to compensate for the IMD generated by the PA nonlinearities, the DPD module 100 must create similar IMD products. As a result, the sampling rate within the DPD module 100 must be several times larger than the Nyquist rate associated with the band limited linear signal to obtain cancellation over the entire IMD bandwidth. In most DPD implementations, the sampling rate is at least 5 times the Nyquist rate of the linear signal. For a transmit bandwidth of 60 MHz, this results in a 300 MHz sampling rate for the DPD module 100. In many cases, the sampling rate of the observation path is the same (300 MHz). The higher sampling rate increases the cost of components such as the Field Programmable Gate Array ("FPGA"), the Digital to Analog Convertor ("DAC"), and the Analog to Digital Convertor ("ADC"), resulting in an expensive transmitter.

Assume a transmit (Tx) filter appears after the PA. If the stop band attenuation is large, the bandwidth of the compensating IMD products generated by the DPD module can be reduced to match the bandwidth of the Tx filter. Embodiments include methods of reducing the sampling rate of the DPD 100 for the special case where a multi-carrier input signal spans the entire bandwidth of the Tx filter but does not occupy it fully.

Figure 4:
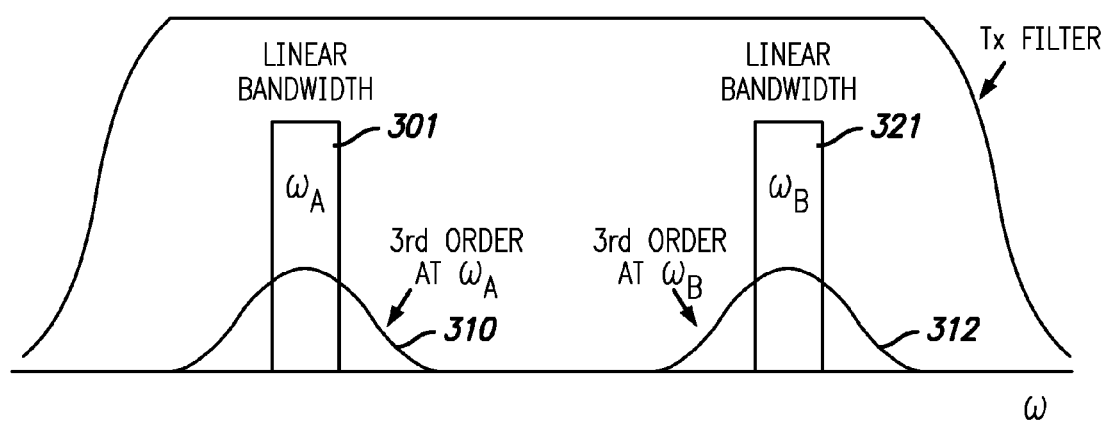
FIG. 4 is a representation of the output spectrum of two carriers widely spaced apart in frequency.

There are many examples where the signal being transmitted comprises two widely spaced carrier clusters located within the Tx bandwidth, as shown in FIG. 4. This may occur when several cellular service providers share the same hardware within a neutral host or as a result of industry consolidation. Large frequency gaps between active carrier groups can occur in Long Term Evolution ("LTE")-Advanced due to the proposed carrier aggregation scheme. In addition, the up-link for LTE-Advanced allows the simultaneous transmission of the physical up-link control channel ("PUCCH") and the physical up-link shared channel ("PUSCH"), which occupies disjoint parts of the allocated band. See 3GPP TR 36.814 v9.0.0. In accordance with the invention, multi-carrier signals such as those shown in FIG. 4 can be predistorted digitally without requiring a significant increase in the DPD sample rate. Assume two carriers, denoted by $x_A(k)$ 301 and $x_B(k)$ 321, are available as separate baseband signals. The individual carriers are up-sampled by a factor of S to match (or exceed) the Tx filter bandwidth. The DPD compensation for the third-order IMD products 310 and 312 is shown in FIG. 5. Only the IMD products falling within the Tx bandwidth are needed. The out-of-band basis waveforms, $x_A^2 x_B^*$ and $x_B^2 x_A^*$, are not computed.

Figure 5:
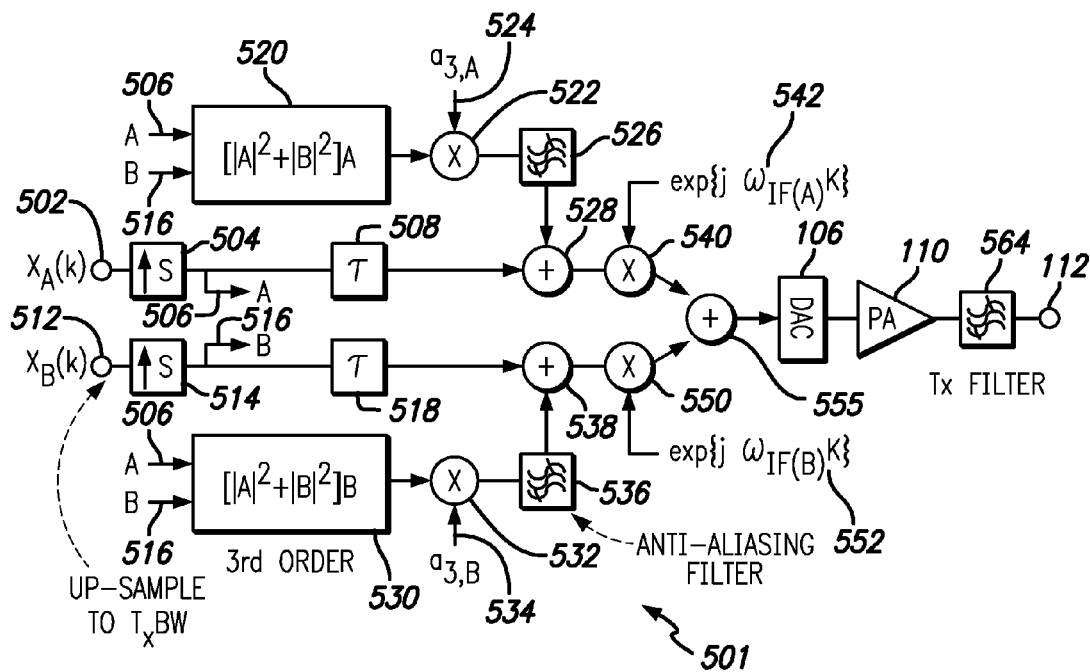
FIG. 5 is an exemplary block schematic diagram of a memoryless digital predistorter for two carriers that are widely spaced in frequency in an embodiment.

FIG. 5 depicts the upper path of FIG. 1 implementing an exemplary embodiment of a memoryless DPD. A modest amount of memory correction can be incorporated into FIG. 5 by weighting the four IMD modes, $|x_A|^2 x_A$, $|x_B|^2 x_B$, $|x_B|^2 x_A$, and $|x_A|^2 x_B$ using separate coefficients. A larger amount of memory correction is possible by creating additional basis waveforms with the gain term delayed by m samples, as in (2).

More specifically, FIG. 5 depicts an exemplary embodiment of a block diagram of a memoryless digital predistorter for two carriers $x_A(k)$ 502 and $x_B(k)$ 512 that are widely spaced apart in frequency. The first carrier $x_A(k)$ 502 is coupled to up-sampler 504 which up-samples the first carrier $x_A(k)$ 502 to generate up-sampled signal "A" 506. The function of up-samplers 504 and 514 is to adjust the sample rate of $x_A(k)$ 502 and $x_B(k)$ 512 to a higher sample rate that is determined by the bandwidth of the Tx filter 564. The up-sampler 504 is coupled to the input of delay 508, and the output of delay 508 is coupled to addition circuit 528. A first intermodulation compensation circuit may comprise first intermodulation distortion product generator 520, first multiplier 522, first anti-aliasing filter 526, first addition circuit 528, first multiplier 540, and first oscillator 542. Up-sampled signals A 506 and B 516 (discussed below) are coupled to the input of a first IMD product generator 520, and the resulting IMD products are received by the multiplier 522, which multiplies the resulting IMD products with the coefficient $a_{3,A}$ 524 which are predetermined and stored or obtained from a coefficient estimator such as coefficient estimator 118 for example. The output of the multiplier 522 is coupled to an anti-aliasing filter 526 and the output of the anti-aliasing filter 526 is coupled to the addition circuit 528 which is also coupled to the output of delay 508. The output of the addition circuit 528 is coupled to the multiplier 540, which multiplies the output of the addition circuit 528 with a digital intermediate signal oscillator output having frequency $\omega_{IF(A)}$ 542 to provide a first predistorted output signal to the combiner 555.

Likewise, the second carrier $x_B(k)$ 512 is coupled to up-sampler 514 which up-samples the second carrier $x_B(k)$ 512 to generate up-sampled signal "B" 516. The up-sampler 514 is coupled to the input of delay 518, and the output of delay 518 is coupled to addition circuit 538. A second intermodulation compensation circuit may comprise second intermodulation distortion product generator 530, second multiplier 532, second anti-aliasing filter 536, second addition circuit 538, second multiplier 550, and second oscillator output 552. Up-sampled signals A 506 and B 516 are coupled to the input of a second IMD product generator 530, and the resulting IMD products are coupled to the multiplier 532, which multiplies the resulting IMD products with the coefficient $a_{3,B}$ 534 obtained from a coefficient estimator such as coefficient estimator 118 for example. The output of the multiplier 532 is coupled to an anti-aliasing filter 536 and the output of the anti-aliasing filter 536 is coupled to the addition circuit 538. The output of the addition circuit 538 is coupled to the multiplier 550, which multiplies the output of the addition circuit 538 with a digital intermediate signal having frequency $\omega_{IF(B)}$ 552 to provide a second predistorted output signal to the combiner 555. Combiner 555 receives and combines the first and second predistorted output signals to provide a predistorted output signal to the DAC 106, which provides an RF signal to power amplifier 110. The output of power amplifier 110 is fed into the bandpass transmission filter 564, which provide the RF output signal to the output 112. Additional components may be provided in the signal transmission path as known in the art.

The DPD may be made adaptive to ensure good distortion cancellation. The observation path used for an adaptive system may be formed by coupling the sampling coupler 114 to the output of the power amplifier 110. Alternatively, the observation path used for an adaptive system may be formed by coupling the sampling coupler 114 to output of the Tx filter 564.

The DPD coefficients $a_i$ are adjusted to minimize the residual distortion in the output signal, which is measured using batches of time-aligned samples of the input and output signals: $\underline{x}_A = [x_A(1) \ldots x_A(K)]^T$, $\underline{x}_B = [x_B(1) \ldots x_B(K)]^T$, and $\underline{y} = [y(1) \ldots y(K)]^T$. The LMS estimate of the coefficient offset from the optimal setting is given in R. N. Braithwaite, "Wide bandwidth adaptive digital predistortion of power amplifiers using reduced order memory correction," 2008 *IEEE MTT-S IMS.*, Atlanta, Ga., Jun. 15-20, 2008, pp. 1517-1520 as $$\underline{\Delta a} = Q_L^{-1} \cdot Z_L^H \cdot L\{\underline{\epsilon}\} \tag{5}$$

where $\underline{\Delta a} = [\Delta a_1 \ldots \Delta a_N]^T$, $()^H$ denotes conjugate transpose, $$Q_L = Z_L^H Z_L, \tag{6}$$

$$Z_L = [L\{\underline{\gamma}_1\} \ldots L\{\underline{\gamma}_N\}], \tag{7}$$

$$\underline{\gamma}_i = [\gamma_i(1) \ldots \gamma_i(K)]^T, \tag{8}$$

and $$\underline{\epsilon} = [\epsilon(1) \ldots \epsilon(K)]^T. \tag{9}$$

The updated DPD coefficients are $$\underline{a}(t_{l+1}) = \underline{a}(t_l) - \eta \cdot \underline{\Delta a} \tag{10}$$

where $\underline{a} = [a_1 \ldots a_N]^T$, $t_l$ indicates the iteration number, and $0 < \eta <= 1$. The process of capturing data, estimating coefficient offsets, and updating the coefficients is repeated, further reducing the output distortion.

Singular value decomposition ("SVD") is used to improve the conditioning of the DPD coefficient estimation. See R. N. Braithwaite, "Wide bandwidth adaptive digital predistortion of power amplifiers using reduced order memory correction," 2008 IEEE MTT-S IMS., Atlanta, Ga., Jun. 15-20, 2008, pp. 1517-1520. Assume the eigenvectors of $Q_L$ are denoted by $\underline{v}_j$, where the index j is listed in order from the largest to smallest eigenvalue $\lambda_j$. The coefficient offset vector $\underline{\Delta a}$ is rewritten as a weighted sum of eigenvectors, $$\underline{\Delta a} = \sum_{j=1}^{N} \Delta \alpha_j \cdot \underline{v}_j \tag{11}$$

where $\underline{\Delta \alpha} = [\Delta \alpha_1 \ldots \Delta \alpha_N]^T$ and $\Delta \alpha_j$ are complex weights. The projection of the output error onto the basis waveforms becomes $$Z_L^H \cdot L\{\varepsilon\} = \sum_{j=1}^{N} \lambda_j \Delta\alpha_j \underline{v}_j. \tag{12}$$

Eigenvectors associated with small eigenvectors $\lambda_j$ can be dropped from (12) without introducing a significant steady-state error in the coefficient estimation because such eigenvectors do not generate discernible distortion modes for the input x(k) and estimation filter L{ }.

Assume the number of dominant eigenvectors used in the estimator is denoted by $N_{est}$. The estimate of the offset weights $\Delta\alpha_j$ is $$\underline{\Delta\alpha} = \Lambda^{-1} \cdot V^H L\{Z\}^H L\{\underline{\varepsilon}\} \tag{13}$$

where $\Lambda = \text{diag}\{\lambda_1, \lambda_2, \ldots, \lambda_{N,est}\}$ and $$V = [\underline{v}_1 \ldots \underline{v}_{N\_est}]. \tag{14}$$

The DPD coefficients are updated using $$\underline{a}(t_{l+1}) = \underline{a}(t_l) - \eta \cdot V \cdot \underline{\Delta\alpha} \tag{15}$$

where $\underline{\Delta\alpha}$ is shortened in length to $[\Delta\alpha_1 \ldots \Delta\alpha_{N,est}]^T$. Since only dominant eigenvectors are used, the number of adaptive coefficients estimated is reduced and condition problems are avoided. Note that the basis waveform set used in the predistortion module remains unchanged.

Figure 6:
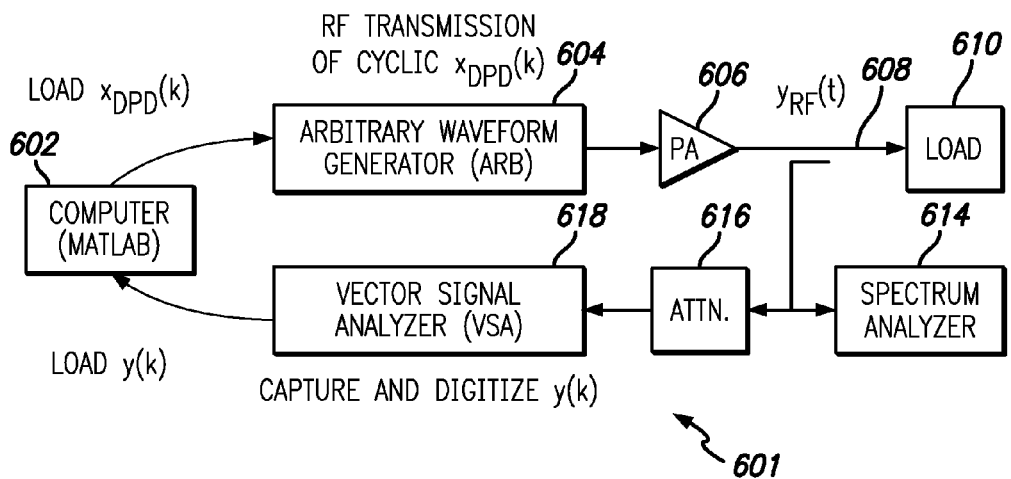
FIG. 6 is a block schematic diagram of a test bench for a digital predistortion compensated transmitter.

Simulations of the DPD correction within the Tx bandwidth for widely spaced carrier clusters are discussed below. The block diagram of the test bench 601 is shown in FIG. 6. The power amplifier 606 has a Doherty configuration using Laterally Diffused Metal Oxide Semiconductor ("LDMOS") transistors. The DPD and estimation modules are implemented on a laptop computer 602 using Matlab. The digitized output observation y(k) is captured using a vector signal analyzer 618 ("VSA") such as the Agilent E4440B PSA employing an attenuator 616. The predistorted signal $x_{DPD}(k)$ is converted to RF using an arbitrary waveform generator 604 such as the Agilent MXG N5182A. A spectrum analyzer 614 such as the Rohde & Schwarz FSEB 20 is used to view the spectrum of the output signal 608 which is coupled to load 610. The predistorted signal $x_{DPD}(k)$ and the captured output signal y(k) are both sampled at 100 MHz. The VSA band limits the captured output signal y(t) to 80 MHz.

The input signal comprises four Wideband Code Division Multiple Access ("WCDMA") carriers, occupying a total of 20 MHz of signal bandwidth. The active carriers appear as two clusters within the outer channels of the 60 MHz Tx bandwidth. The center frequency of the multi-carrier signal (which corresponds to the LO of the ARB) is 1960 MHz. In the first example (see FIG. 7A), the four active carriers are centered at $\omega = [1935, 1940, 1985, 1990]$ MHz. The carrier frequencies, relative to the LO, are selected to make the image spectrum from modulator imbalances visible within inactive channels located at 1930 and 1980 MHz. In the second example (see FIG. 7B), the carrier frequencies are located at $\omega = [1935, 1945, 1980, 1990]$ MHz, and the image spectrum is visible at [1930, 1940, 1975, 1985] MHz. In each example, the baseband signal $x_A(k)$ comprises the two carriers below 1960 MHz. The other two carriers are assigned to $x_B(k)$.

The basis waveforms are selected to fall within the observation bandwidth of the VSA 618. The basis waveforms near $x_A(k)$ are listed below. Those near $x_B(k)$ are obtained by interchanging the subscripts A and B. Memoryless basis waveforms for the individual carriers are $$\gamma_i(k) = |x_A(k)|^n \cdot x_A(k) \tag{16}$$

for n=0 to 6. For n=4, basis waveforms comprising both $x_A(k)$ and $x_B(k)$ are included:

$$\gamma_i(k) = |x_A(k)|^2 \cdot |x_B(k)|^2 \cdot x_A(k). \tag{17}$$

$$\gamma_i(k) = |x_B(k)|^4 \cdot x_A(k) \tag{18}$$

For n=2, memory basis waveforms are included:

$$\gamma_i(k) = |x_A(k-m)|^2 x_A(k) \tag{19}$$

$$\gamma_i(k) = |x_B(k-m)|^2 x_A(k) \tag{20}$$

where m=−2 to 2. It is also beneficial to include constant and conjugate terms to remove LO leakage and modulator imbalances: $\gamma_i(k)=1$, $\gamma_i(k)=x_A^*(k)$, and $\gamma_i(k)=x_B^*(k)$.

The basis waveform set used in the DPD module has an order of N=37. However, the order of the estimator is reduced because the original set is over-specified for the input signals $x_A(k)$ and $x_B(k)$. The order of the estimator is reduced to $N_{est}=12$ in the first example and $N_{est}=15$ in the second.

Figure 7A:
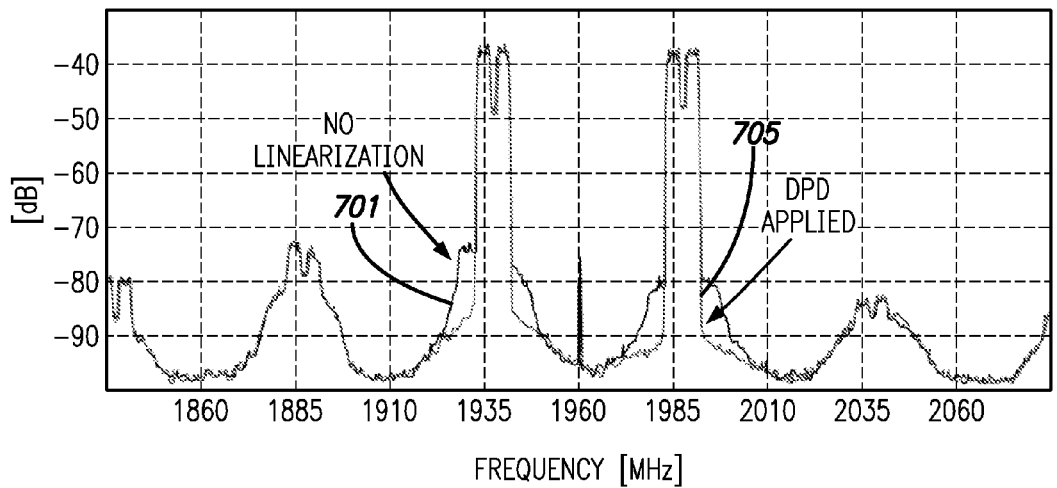
FIG. 7A is a representation of simulated output spectra as seen by the spectrum analyzer for active carrier frequencies ω centered at 1935, 1940, 1985, and 1990 MHz.
Figure 7B:
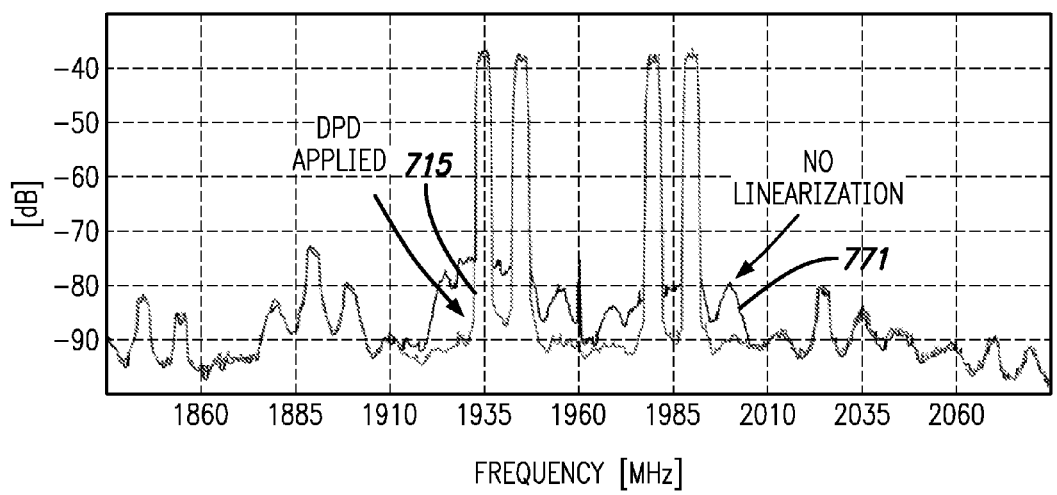
FIG. 7B is a representation of simulated output spectra as seen by the spectrum analyzer for active carrier frequencies ω centered at 1935, 1945, 1980, and 1990 MHz.

The output spectra for the two examples, as measured by the spectrum analyzer 614, are shown in FIGS. 7A and 7B, as the traces having no linearization (traces 701 and 771) and the traces after the DPD linearization (traces 705 and 715). The WCDMA specification requires that Adjacent Channel Leakage Ratio ("ACLR") exhibit values $\text{ACLR}_1 < -45$ dBc and $\text{ACLR}_2 < -50$ dBc, which are met in both examples over a bandwidth from 1910 to 2010 MHz, after the linearization is applied. See 3GPP TS 25.104 (Table 6.7). The worst case values for $\text{ACLR}_1$ and $\text{ACLR}_2$ are −48.6 dBc and −51.6 dBc for the first example (FIG. 7A) and −47.6 dBc and −51.3 dBc for the second example (FIG. 7B). For the second example depicted in FIG. 7B, the worst-case $\text{ACLR}_1$ (after linearization) appears at 1940 MHz, which is due primarily to the quadrature errors rather than residual nonlinear modes. Distortion beyond the 100 MHz bandwidth is not corrected because of the 100 MHz sampling rate used in the DPD module and the fact that the basis waveforms were selected to be near the two carrier clusters. The output Tx filter would have to provide an additional 20 dB of stop band attenuation to reduce the uncancelled out-of-band distortion, in particular the IMD products near 1885 MHz.

Figure 8A:
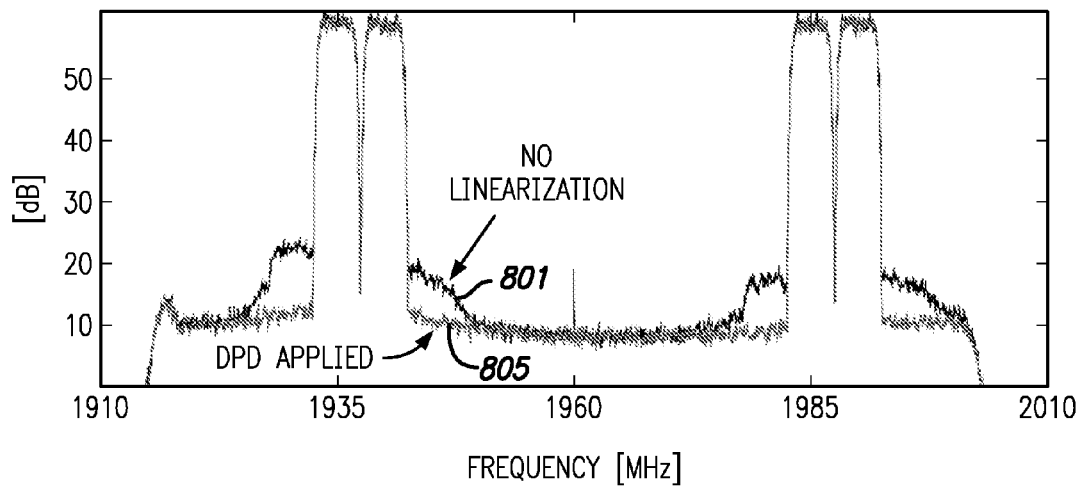
FIG. 8A is a representation of simulated output spectra as computed from the VSA data capture y(k) for active carrier frequencies ω centered at 1935, 1940, 1985, and 1990 MHz.
Figure 8B:
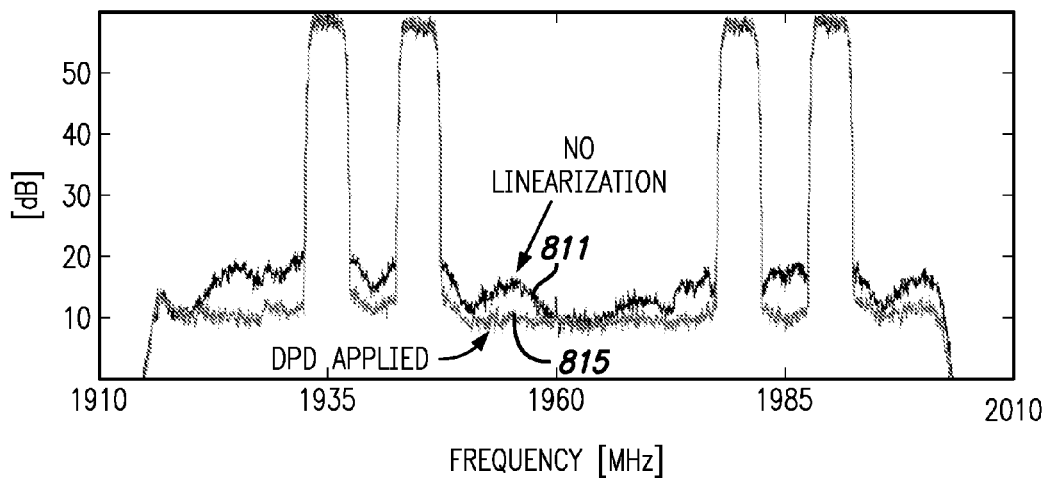
FIG. 8B is a representation of simulated output spectra as computed from the VSA data capture y(k) for active carrier frequencies ω centered at 1935, 1945, 1980, and 1990 MHz.

The output spectra computed from the VSA 618 data captures y(k) are shown in FIGS. 8A and 8B. Traces 801 and 811 show the output signal without linearization, but partially corrected for LO leakage and modulator imbalances. Traces 805 and 815 are the linearized output. The DPD reduces the distortion to noise floor of the VSA 618, although some residual effects of modulator imbalances are still visible at 1930 and 1940 MHz for the second example shown in FIG. 8B.

The sample rate used in the DPD module can be reduced when a multi-carrier input signal with two widely spaced carrier clusters spans the Tx bandwidth. The reduced sampling rate for the DPD system requires additional stop band attenuation from the Tx filter located after the power amplifier. For the 60 MHz Tx BW case demonstrated, the sampling rate is reduced from 300 MHz to 100 MHz which lowers the cost of the transmitter significantly.

The present invention has been described primarily as a system and method for digital predistortion of an RF power amplifier for signals comprising two widely spaced carrier clusters. In this regard, the system and methods for predistortion of RF power amplifier for a signal having two widely spaced carrier clusters are presented for purposes of illustration and description. Furthermore, the description is not intended to limit the invention to the form disclosed herein. Accordingly, variants and modifications consistent with the following teachings, skill, and knowledge of the relevant art, are within the scope of the present invention. The embodiments described herein are further intended to explain modes known for practicing the invention disclosed herewith and to enable others skilled in the art to utilize the invention in equivalent, or alternative embodiments and with various modifications considered necessary by the particular application(s) or use(s) of the present invention.

What is claimed is:

1. A predistortion linearized amplifier system for amplifying a communication signal comprising:
    a digital predistorter comprising:
    a first component signal path and a second component signal path, each component signal path comprising:
        an input, each input adapted to receive a signal component of a communication signal the communication signal having at least a first signal component comprising a first carrier cluster and a second separate signal components comprising a second carrier cluster separate from the first carrier cluster;
        up-sampler circuitry that receives the signal component from the input;
        input delay circuitry that receives a first up-sampled signal from the up-sampler;
        an intermodulation distortion product generator that receives the first up-sampled signal from the up-sampler and a second up-sampled signal from corresponding up-sampler circuitry of another component signal path;
        an addition circuit coupled to an output of input delay circuitry and an output of the intermodulation distortion product generator; and
        a multiplier coupled to an output of the addition circuit;
    combiner circuitry coupled to an output of the multiplier of the first component signal path and the multiplier of the second component signal path that generates a combined predistorted output signal;
    a digital to analog converter coupled to the combiner circuitry receive the combined predistorted output signal and provide an analog signal; and,
    a power amplifier coupled to the digital to analog converter and configured to amplify the analog signal to provide an amplified analog signal.

2. A predistortion linearized amplifier system as set out in claim 1, further comprising:
    a bandpass filter coupled to the power amplifier and configured to filter the amplified analog signal to provide a bandpass filtered signal;
    an output sampling coupler coupled to the bandpass filter and configured to sample the bandpass filtered signal to provide a sampled bandpass filtered signal;
    a feedback circuit path coupled to the output sampling coupler comprising an analog to digital convertor converting the sampled bandpass filtered signal to a digital sampled signal representative of the bandpass filtered signal; and,
    a coefficient estimator receiving the digital sampled signal and the first and second separate signal components and providing the first and second predistortion coefficients to the digital predistorter.

3. A pre distortion linearized amplifier system as set out in claim 1, wherein the digital predistorter is a memory less digital predistorter.

4. A pre distortion linearized amplifier system as set out in claim 1, wherein the addition circuit of each component signal path is coupled to the intermodulation distortion product generator of the corresponding component signal path via multiplier circuitry of the corresponding component signal path and an anti-aliasing filter of the corresponding component signal path.

5. A predistortion linearized amplifier system for amplifying a communication signal having at least first and second separate signal components, comprising:
    one or more inputs adapted to receive a communication signal, the communication signal having at least first and second separate signal components;
    a digital predistorter coupled to the one or more inputs and receiving a delayed first up-sampled signal and a delayed second up-sampled signal of the at least first and second separate signal components,
    the digital predistorter outputting a combined predistorted output signal, wherein a first predistorted output signal of the combined predistorted output signal is based on a first predistortion coefficient, a first set of intermodulation distortion products and the delayed first up-sampled signal, and wherein a second predistorted output signal of the combined predistorted output signal is based on a second predistortion coefficient, a second set of intermodulation distortion products and the delayed second up-sampled signal,
    a digital to analog converter coupled to receive the combined predistorted output signal and provide an analog signal; and,
    a power amplifier coupled to the digital to analog converter and configured to amplify the analog signal to provide an amplified analog signal;
    wherein the digital predistorter comprises:
    a first up-sampler adapted to receive the first separate signal component and providing a first up-sampled signal;
    a first delay coupled to the first up-sampler and providing the delayed first up-sampled signal;
    a second up-sampler adapted to receive the second separate signal component and providing a second up-sampled signal; and
    a second delay coupled to the second up-sampler and providing the delayed second up-sampled signal;
    a first intermodulation distortion product generator receiving the first and second up-sampled signals, the first intermodulation distortion product generator providing the first set of intermodulation distortion products of the first and second up-sampled signals;
    a first multiplier circuit coupled to the first intermodulation distortion generator which receives and applies the first pre distortion coefficients to the first set of intermodulation distortion products to provide a first pre distortion signal;
    a first combiner adapted to receive the delayed first up-sampled signal and coupled to the first multiplier circuit, the first combiner providing a first predistorted input signal based on the delayed first up-sampled signal and the first pre distortion signal;
    a second intermodulation distortion product generator receiving the first and second up-sampled signals, the second intermodulation distortion generator providing the second set of intermodulation distortion products of the first and second up-sampled signals;
    a second multiplier circuit coupled to the second intermodulation distortion generator which receives and applies the second predistortion coefficients to the second set of intermodulation distortion products to provide a second predistortion signal; and
    a second combiner adapted to receive the delayed second up-sampled signal and coupled to the second multiplier circuit, the second combiner providing a second predistorted input signal based on the delayed second up-sampled signal and the second predistortion signal.

6. A predistortion linearized amplifier system as set out in claim 5, wherein the digital predistorter further comprises:
a first digital oscillator providing a first digital intermediate signal;
a first oscillator multiplier which receives and combines the first predistorted input signal and the first digital intermediate signal to provide the first predistorted output signal;
a second digital oscillator providing a second digital intermediate signal; and,
a second oscillator multiplier which receives and combines the second predistorted input signal and the second digital intermediate signal to provide the second predistorted output signal.

7. A predistortion linearized amplifier system as set out in claim 5, wherein the first and second up-samplers are adapted to up sample the first and second separate signal components at a sampling rate to approximately match the bandwidth of the bandpass filter.

8. A predistortion linearized amplifier as set out in claim 7, wherein the bandpass filter attenuates distortion modes exceeding the sampling rates of the first and second up-samplers.

9. A predistorter for use in predistortion of a communication signal having at least first and second separate signal components, comprising:
a first input adapted for receiving a first separate signal component;
a second input adapted for receiving a second separated signal component;
a first intermodulation distortion compensation circuit receiving first predistortion coefficients and the first and second separate signal components, the first intermodulation distortion compensation circuit creating a first set of intermodulation distortion products and providing a first predistorted output signal based on the first set of intermodulation distortion products, the first predistortion coefficients, and the first separate signal component;
a second intermodulation distortion compensation circuit receiving second predistortion coefficients and the first and second separate signal components, the second intermodulation distortion compensation circuit creating a second set of intermodulation distortion products and providing a second predistorted output signal based on the second set of intermodulation distortion products, the second predistortion coefficients, and the second separate signal component;
a first up-sampler coupled to the first input and providing a first up-sampled signal; and,
a second up-sampler coupled to the second input and providing a second up-sampled signal;
wherein the first and second intermodulation distortion compensation circuits operate on the first and second up-sampled signals, and,
a combiner circuit which receives and combines the first and second predistorted output signals to provide a combined predistorted output signal; and
wherein:
the first intermodulation distortion compensation circuit comprises:
a first intermodulation distortion product generator providing the first set of intermodulation distortion products of the first and second separate signal components;
a first multiplier circuit coupled to the first intermodulation product distortion generator which receives and applies the first predistortion coefficients to the first set of intermodulation distortion products to provide a first predistortion signal;
a first combiner coupled to the first input and the first multiplier circuit, the first combiner providing a first predistorted input signal based on the first separate signal component and the first pre distortion signal;
a first digital oscillator providing a first digital intermediate signal; and
a first oscillator multiplier which receives and combines the first predistorted input signal and the first digital intermediate signal to provide the first predistorted output signal; and
wherein the second intermodulation distortion compensation circuit comprises:
a second intermodulation distortion product generator providing the second set of intermodulation distortion products of the first and second separate signal components;
a second multiplier circuit coupled to the second intermodulation distortion product generator which receives and applies the second pre distortion coefficients to the second set of intermodulation distortion products to provide a second predistortion signal;
a second combiner coupled to the second input and the second multiplier circuit, the second combiner providing a second predistorted input signal based on the second separate signal component and the second predistortion signal;
a second digital oscillator providing a second digital intermediate signal: and,
a second oscillator multiplier which receives and combines the second predistorted input signal and the second digital intermediate signal to provide the second predistorted output signal.

10. A predistorter as set out in claim 9, wherein the predistorter compensates for the third order intermodulation products of the first and second separate signal components.

11. A predistorter as set out in claim 9, wherein the first and second up-samplers are adapted to up sample the first and second separate signal components at a sampling rate to approximately match the allowed transmission bandwidth of the communication signal.

12. A method for predistortion linearization of a signal in a communication system, the signal having two separate components, the method comprising:
receiving a first input signal component at a first input;
providing a delayed first up-sampled signal of the first input signal component from a first up-sampler coupled to the first input;
receiving a second input signal component at a second input;
providing a delayed second up-sampled signal of the second input signal component from a second up-sampler coupled to the second input;
receiving first predistortion coefficients and the first and second separate signal components at a first intermodulation distortion compensation circuit, the first intermodulation distortion compensation circuit creating a first set of intermodulation distortion products and providing a first predistorted output signal based on the first set of intermodulation distortion products, the first predistortion coefficients, and the first separate signal component;
receiving second predistortion coefficients and the first and second separate signal components at a second intermodulation distortion compensation circuit, the second intermodulation distortion compensation circuit creating a second set of intermodulation distortion products and providing a second predistorted output signal based on the second set of intermodulation distortion products, the second predistortion coefficients, and the second separate signal component;

providing a first predistorted output signal based on the first set of intermodulation distortion products of the first and second input signal components, the first predistortion coefficients, and the delayed first up-sampled signal by:
  providing the first set of intermodulation distortion products of the first and second separate signal components using a first intermodulation distortion product generator;
  receiving and applying the first predistortion coefficients to the first set of intermodulation distortion products to provide a first predistortion signal using a first multiplier circuit coupled to the first intermodulation product distortion generator;
  providing a first predistorted input signal based on the first separate signal component and the first predistortion signal using a first combiner coupled to the first input and the first multiplier circuit;
  providing a first digital intermediate signal using a first digital oscillator; and
  receiving and combining the first predistorted input signal and the first digital intermediate signal to provide the first predistorted output signal using a first oscillator multiplier;

providing a second predistorted output signal based on the second set of intermodulation distortion products of the first and second signal components, the second predistortion coefficients, and the delayed second up-sampled signal by:
  providing the second set of intermodulation distortion products of the first and second separate signal components using a second intermodulation distortion product generator;
  receiving and applying the second predistortion coefficients to the second set of intermodulation distortion products to provide a second predistortion signal using a second multiplier circuit coupled to the second intermodulation distortion product generator;
  providing a second predistorted input signal based on the second separate signal component and the second predistortion signal using a second combiner coupled to the second input and the second multiplier circuit;
  providing a second digital intermediate signal using a second digital oscillator; and,
  receiving and combining the second predistorted input signal and the second digital intermediate signal to provide the second predistorted output signal using a second oscillator multiplier; and, combining the first and second predistorted output signals using a combiner circuit to provide a combined predistorted output signal.

13. A method for pre distortion linearization as set out in claim 12, wherein the first and second set of intermodulation distortion products comprise third order intermodulation product signals.

14. A method for predistortion linearization as set out in claim 13, further comprising:
converting the combined predistorted output signal into an analog output signal; and,
filtering the analog output signal by a transmission filter to provide a bandpass filtered signal;
wherein the third order intermodulation product signals comprise intermodulation product signals having frequencies within the transmission filter passband.

15. A method for predistortion linearization as set out in claim 14, further comprising: sampling the bandpass filtered signal to provide a sampled bandpass filtered signal; and, adaptively estimating the first and second predistortion coefficients based on the sampled bandpass filtered signal.

16. A method for predistortion linearization as set out in claim 15, wherein adaptively estimating the first and second predistortion coefficients further comprises comparing the sampled bandpass filtered signal with the first and second input signal components to adaptively update the first and second predistortion coefficients.

17. A method for predistortion linearization as set out in claim 16, wherein adaptively estimating the first and second predistortion coefficients further comprises computing iteratively updated first and second predistortion coefficients based on prior first and second predistortion coefficients, respectively.

18. A method for predistortion linearization as set out in claim 14, further comprising up sampling the first and second input signal components at a sampling rate that meets or exceeds the bandwidth of the transmission filter passband.

19. A method for predistortion linearization as set out in claim 14, wherein the frequencies of the first and second signals span the bandwidth of the transmission filter passband.

* * * * *